(12) United States Patent
Lee

(10) Patent No.: US 7,625,800 B2
(45) Date of Patent: Dec. 1, 2009

(54) METHOD OF FABRICATING MOS TRANSISTOR

(75) Inventor: Yong Geun Lee, Choongcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 375 days.

(21) Appl. No.: 11/318,518

(22) Filed: Dec. 28, 2005

(65) Prior Publication Data

US 2006/0141720 A1 Jun. 29, 2006

(30) Foreign Application Priority Data

Dec. 29, 2004 (KR) ............... 10-2004-0115792

(51) Int. Cl.
*H01L 21/336* (2006.01)
(52) U.S. Cl. ............... 438/299; 438/583; 257/E21.444
(58) Field of Classification Search ................ 438/197, 438/217, 270, 282, 299, 300, 301, 303, 305, 438/306, 581–583, 592; 257/E21.43, E21.432, 257/E21.437, E21.438, E21.444
See application file for complete search history.

(56) References Cited

U.S. PATENT DOCUMENTS

| | | | | |
|---|---|---|---|---|
| 4,564,583 A | * | 1/1986 | Maeguchi | 430/312 |
| 5,428,240 A | * | 6/1995 | Lur | 438/305 |
| 5,434,093 A | * | 7/1995 | Chau et al. | 438/300 |
| 5,538,913 A | * | 7/1996 | Hong | 438/282 |
| 6,025,232 A | * | 2/2000 | Wu et al. | 438/270 |
| 6,214,677 B1 | * | 4/2001 | Lee | 438/284 |
| 6,225,173 B1 | * | 5/2001 | Yu | 438/301 |
| 6,770,532 B2 | * | 8/2004 | Chuang et al. | 438/257 |

* cited by examiner

*Primary Examiner*—Brook Kebede
(74) *Attorney, Agent, or Firm*—McKenna Long & Aldridge LLP

(57) ABSTRACT

A method for fabricating a MOS transistor is suitable for modifying the configuration of a gate electrode. The method includes coating a first oxide layer on a semiconductor substrate and removing a predetermined width of the first oxide layer; forming an LDD region in the substrate; forming a gate spacer on the substrate; forming a channel in the LDD region, forming a gate oxide layer; forming a polysilicon gate electrode; and forming source/drain diffusion regions. Accordingly, a line width of the gate electrode can be reduced without employing lithography of high precision, and an area reserved for salicide can be maximally secured on the gate and source/drain regions.

3 Claims, 6 Drawing Sheets

METHOD OF FABRICATING MOS TRANSISTOR

This application claims the benefit of Korean Patent Application No. 10-2004-0115792, filed on Dec. 29, 2004, which is hereby incorporated by reference for all purposes as if fully set forth herein.

BACKGROUND OF THE INVENTION

1. Field of the Invention

The present invention relates to semiconductor devices, and more particularly, to a MOS transistor and fabricating method thereof. Although the present invention is suitable for a wide scope of applications, it is particularly suitable for modifying a configuration of a gate electrode.

2. Discussion of the Related Art

Generally, in fabricating a semiconductor integrated circuit, one transistor is fabricated on a silicon die of 1-2 mm in the early stage of development. Lately, millions of unit devices are integrated on a 20 mm×20 mm silicon die. A size of a unit transistor needs to be reduced into a minimal size to enable such a fabrication of the integrated circuit. For this, many efforts are made to research and develop various fabricating processes.

To scale-down a unit transistor configuring an integrated circuit, a substrate of a very thin junction having a high degree of diffusion and a very large curvature in source-drain diffusion regions is needed. Thus, in the drain-substrate junction having a steep density slope of impurities, a problem of impact ionization attributed to hot carriers is induced. To solve this problem, the lightly doped drain (LDD) structure has been developed. The LDD structure is formed by defining a boundary of a polysilicon gate and forming an LDD extension line that settles an extension of channel using N-type impurities.

After a gate electrode and source-drain diffusion regions of a transistor have been formed, a contact with a metal line is formed to electrically connect them to an external device. A sheet resistance of the source-drain diffusion region fails in avoiding being reduced below 10-20 ohms/square. Forming the polysilicon gate to be thin according to the scale-down of the transistor also fails in avoiding being reduced below 10-20 ohms/square. Hence, usefulness as a mutual access medium is considerably decreased.

To solve this problem and to enhance the mutual access, a method of forming silicide having a low specific resistance on silicon of a gate or source-drain region has been developed. In particular, a process of forming silicide on both of the gate and the source-drain regions of the transistor is called salicidation. Salicidation is able to eliminate parasitic capacitance caused by the overlapping that may be generated between the source/drain and the gate. Salicidation is able to reduce contact resistance and source/drain internal resistance due to the increased contact area between metal and source/drain.

A method of fabricating a MOS transistor in a semiconductor device according to a related art is explained with reference to FIGS. 1A to 1E, as follows.

First, on an active area of a substrate 10 reserved for a transistor, a gate oxide 20 and a polysilicon 30 are sequentially stacked. They are then patterned by photolithography to remain on an area reserved for a gate electrode only. Hence, a structure shown in FIG. 1A is configured.

Referring to FIG. 1B, ion implantation is carried out with low-density impurities having a conductive type opposite to that of the substrate 10 using the polysilicon gate 30 formed in FIG. 1A as a mask. The substrate 10 is then annealed to form an LDD region 22a.

After the LDD region 22a has been formed, an oxide layer is formed over the substrate 10 by low-pressure chemical vapor deposition. The oxide layer is then etched to remain on a sidewall of the gate 30 only. The oxide layer remaining on the sidewall of the gate 30 is a spacer 32 that serves to prevent a short-circuit between the gate and a source/drain diffusion region in salicidation The spacer 32 is shown in FIG. 1C.

Referring to FIG. 1D, impurity ion implantation and annealing are carried out using the polysilicon gate and spacer 30 and 32 as a mask to form heavily doped source/drain diffusion regions 22b. Subsequently, a metal such as Co, Ti, and the like is deposited over the substrate 10 to form salicide by reaction with silicon or polysilicon. Salicide layers are then formed on the polysilicon gate and the source/drain diffusion regions over the silicon substrate by sintering. Metal that does not react is selectively removed by etching. Thus, the self-aligned silicide is called salicide. The salicide layers 24a and 24b are formed on the polysilicon gate 30 and the source/drain diffusion regions, respectively.

However, the related art method of fabricating the semiconductor device has the following problems or disadvantages.

First, as the degree of integration of the circuit increases, the unit transistor devices are formed adjacent to each other. If so, as the gate electrodes of the transistors are provided too close to each other, a gap between the gates becomes narrower. Hence, an exposed area of the source/drain diffusion region between the gates having the oxide spacers 32 formed thereon respectively is reduced. That is, the area having the salicide formed thereon in the source/drain diffusion region, as shown in FIG. 2, is considerably reduced. Hence, a space margin for forming a contact in the source/drain diffusion region becomes short. The sheet resistance increases since it is difficult to form the salicide.

Secondly, the increased degree of integration of the circuit means the fine reduction of a width of the gate electrode. Therefore, the salicide formed on the narrow gate electrode is provided with an insufficient area. Hence, limitation is put on the formation of a low-resistance line on the gate electrode.

Thirdly, a photoresist pattern having the same width of the gate electrode 30 is needed to form the gate electrode 30 as shown in FIG. 1A. If the line width of the gate electrode 30 is finely reduced, a margin for photolithography becomes short. Therefore, to form the gate having the fine line width, precision of equipment for photomasks needs to be enhanced. This can increase product costs.

SUMMARY OF THE INVENTION

Accordingly, the present invention is directed to a method of fabricating a MOS transistor that substantially obviate one or more problems due to limitations and disadvantages of the related art.

An advantage of the present invention is to provide a method of fabricating a MOS transistor, by which a gate structure is modified to provide a narrow line width of a gate electrode without performing lithography of high precision.

Another advantage of the present invention is to provide a method of fabricating a MOS transistor, by which an area to form salicide on a gate and a source/drain region is maximized through structural modifications of an LDD region and gate electrode.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the invention, as embodied and broadly described, there is provided a method of fabricating a MOS transistor, the method comprising coating a semiconductor substrate with a first oxide layer and removing a predetermined width of the first oxide layer by performing a photolithography process to the first oxide layer; forming an LDD region by ion implantation and annealing using the first oxide layer as a barrier wherein the ion implantation uses impurities of a conductive type opposite that of the semiconductor substrate; forming a gate spacer by coating the semiconductor substrate with a second oxide layer and etching the second oxide layer; forming a channel in the LDD region by ion implantation and annealing using the first oxide layer and the gate spacer as a barrier; forming a gate oxide layer on a surface of the semiconductor substrate between edges of the gate spacer; forming a polysilicon gate electrode by coating the first oxide layer, the gate spacer, and the gate oxide layer with a polysilicon layer and performing photolithography and etching processes to the polysilicon layer; and forming, by annealing, source/drain diffusion regions by ion implantation of impurities of a conductive type opposite that of the semiconductor substrate using the gate electrode and the gate spacer as a barrier.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1A:
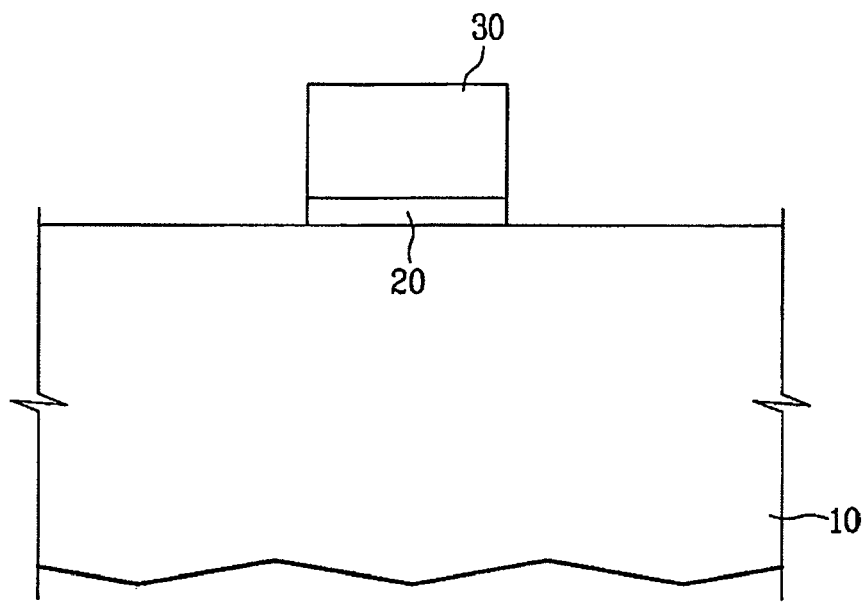
FIGS. 1A to 1D are cross-sectional diagrams of a method of fabricating a MOS transistor having a spacer and LDD structure according to a related art.
Figure 1B:
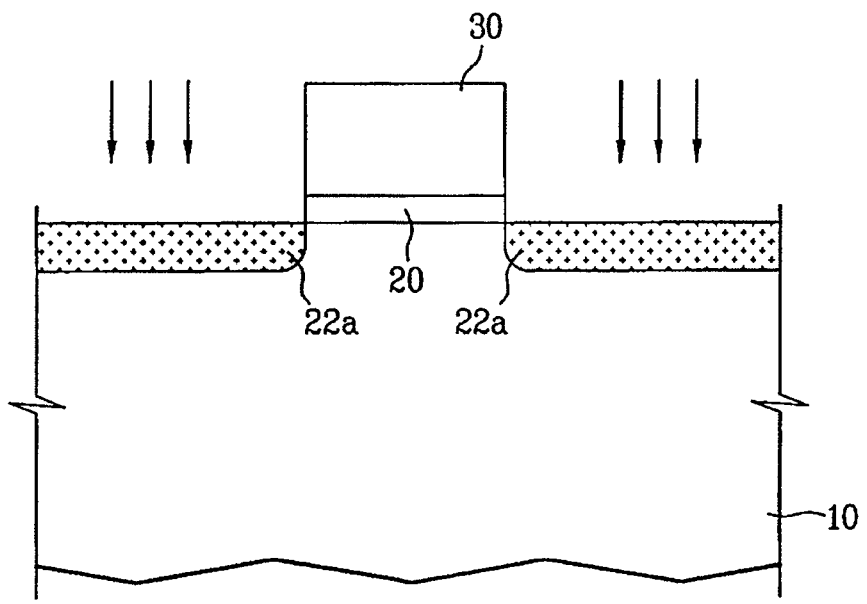
Figure 1C:
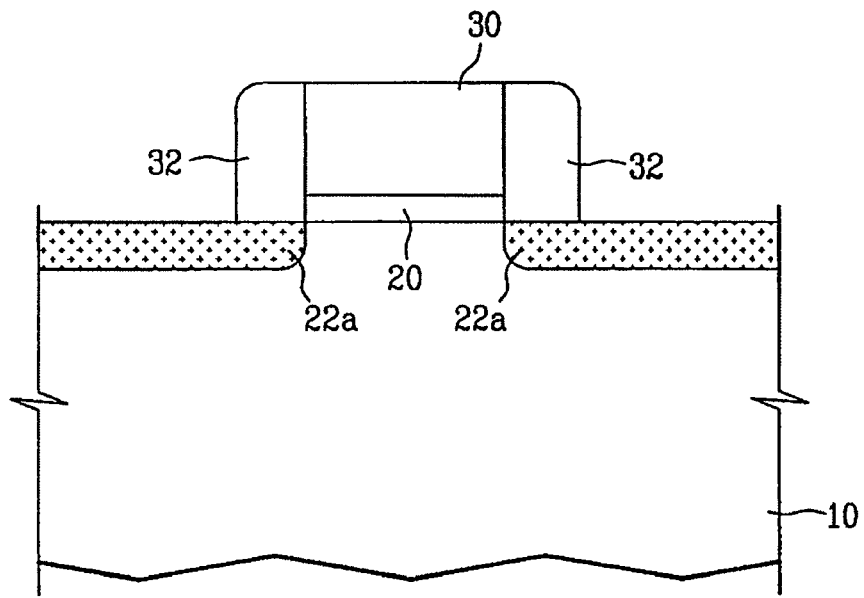
Figure 1D:
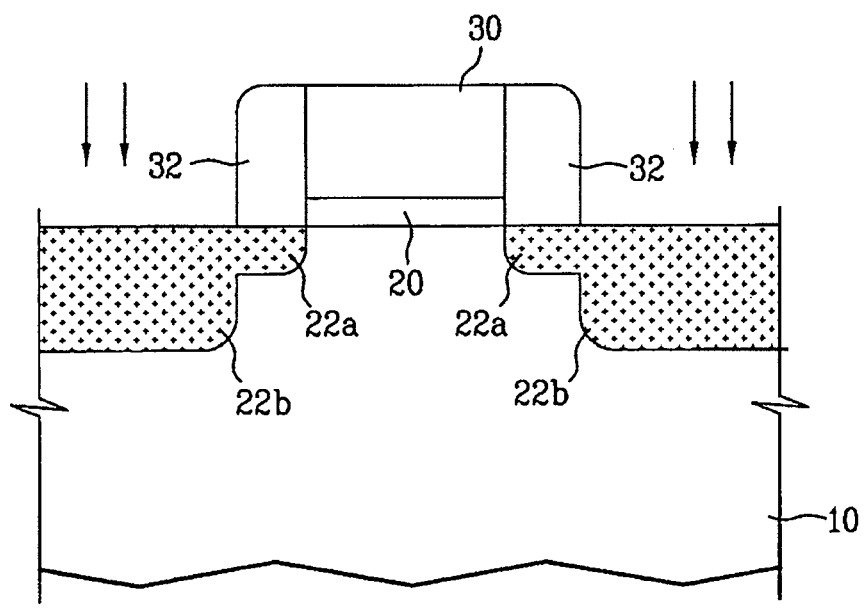
Figure 1E:
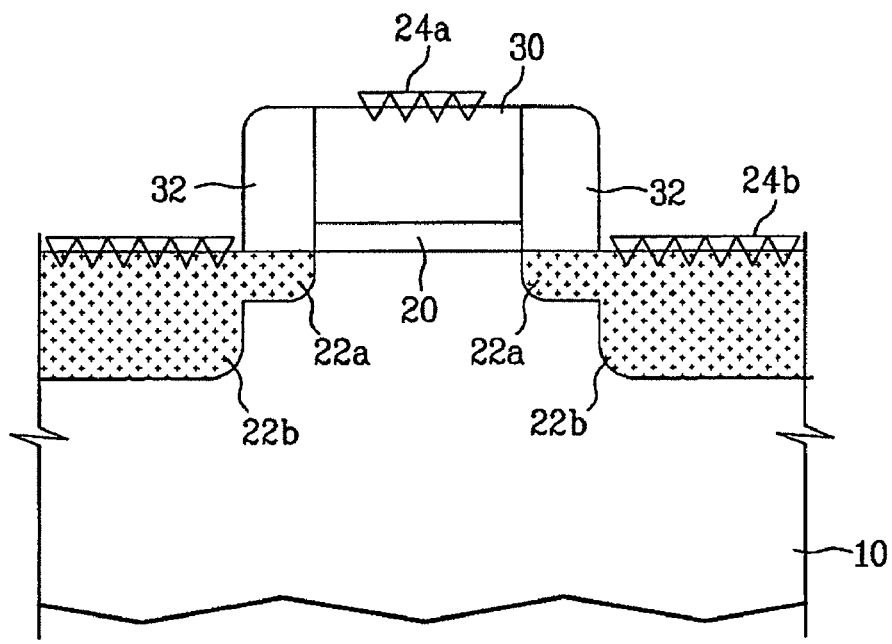
Figure 2:
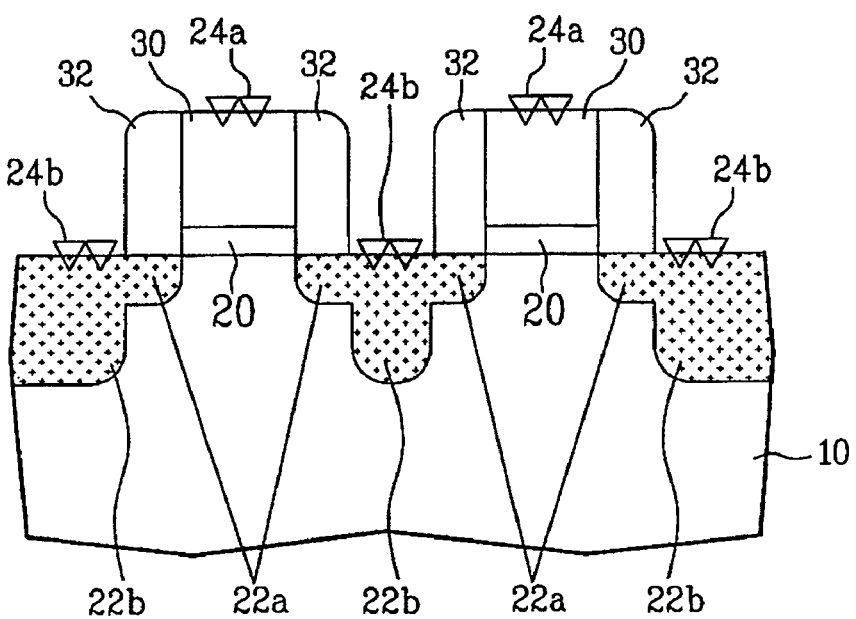
FIG. 2 is a cross-sectional diagram of MOS transistors fabricated according to the related art method illustrating a space shortage problem occurring when forming salicide layers on a gate and a gap between the corresponding gates.
Figure 3A:
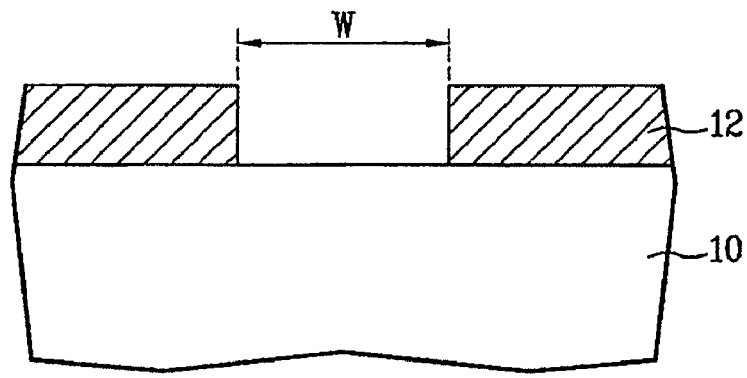
FIGS. 3A to 3I are cross-sectional diagrams of a method of fabricating a MOS transistor according to the present invention.

Referring to FIG. 3A, an oxide layer is formed to be thick on a semiconductor substrate 10. An oxide layer pattern 12 exposing a surface of the substrate 10 with a predetermined width (W) is then established by photolithography. A photomask used in the photolithography can form a pattern having a width twice greater than that of a gate line. For instance, the width W corresponds to about 0.36 μm to form a gate having a line width of 0.18 μm. This is to consider not only the line width of the gate but also a thickness of a spacer that will be formed on both sidewalls of the gate. Thus, since the photomask having the greater width in forming a gate having the same line width can be used, it is unnecessary to perform lithography of relatively high precision.

Figure 3B:
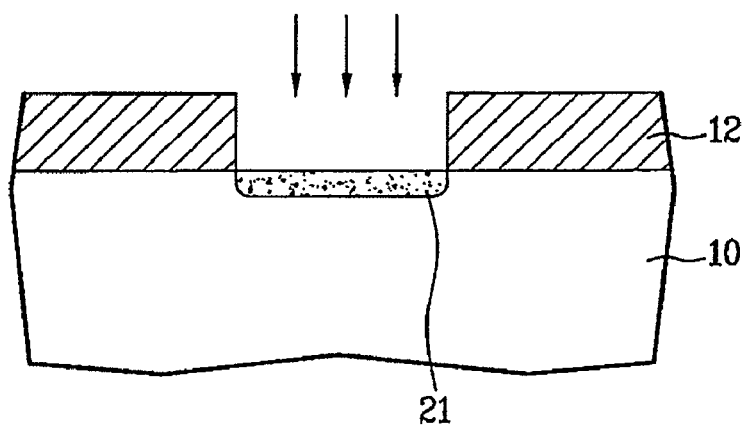

Referring to FIG. 3B, implantation for LDD formation is performed. Low-density ion implantation at low energy with impurities having a conductive type opposite that of the substrate 10 is performed on the surface of the substrate 10 exposed via the oxide layer pattern 12. Annealing is then performed on the substrate to form an LDD region 21.

Figure 3C:
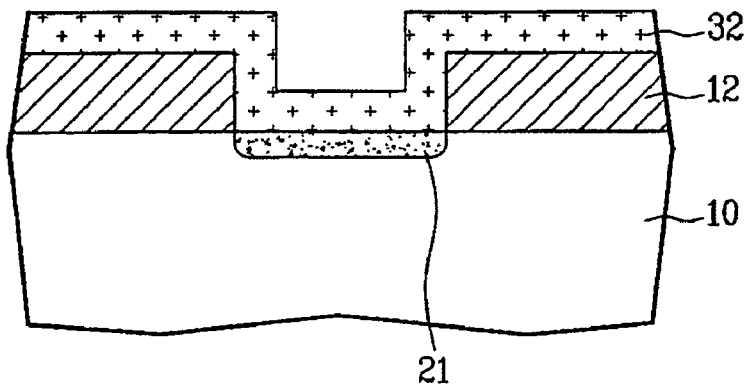

Referring to FIG. 3C, after the LDD region 21 has been formed, a spacer oxide layer 32 is formed on the oxide layer 12 and the exposed surface of the substrate 10 by low-pressure chemical vapor deposition.

Figure 3D:
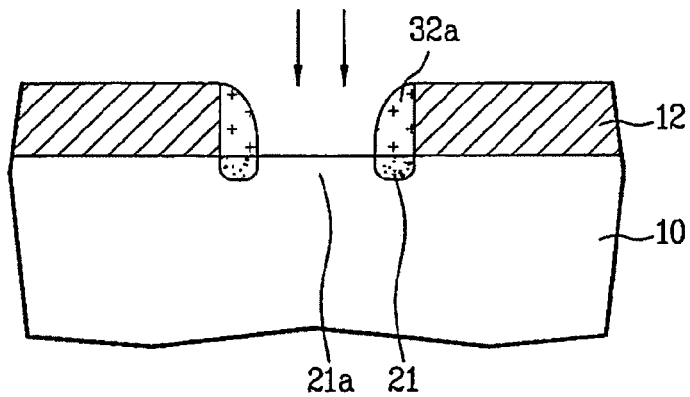

Referring to FIG. 3D, the spacer oxide layer 32 is then etched to remain on sidewalls of the oxide layer pattern 12. Hence, a gate spacer 32a is formed.

Impurities having a conductive type opposite that of those used in the LDD implantation are implanted in a surface of the substrate 10 exposed between the opposing edges of the spacers 32a. A channel 21a is formed in the LDD region 21 due to the opposite-conductivity impurity implantation. Namely, the implantation performed in FIG. 3D is a channel implantation for forming the channel 21a. The opposite-conductivity impurities, which can cancel out the former impurities having been implanted in the LDD implantation, are selected and implanted so that the channel 21a can have an appropriate density.

Figure 3E:
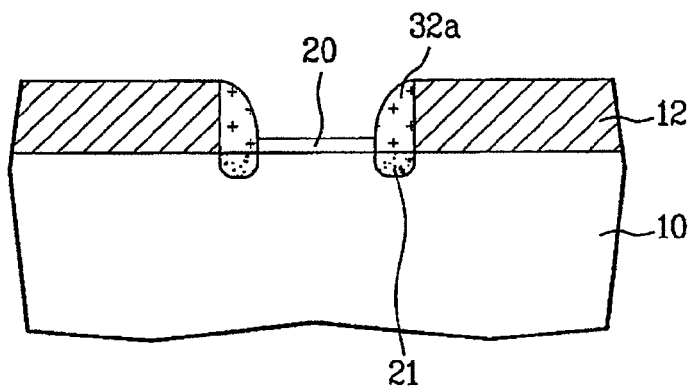

Referring to FIG. 3E, a gate oxide layer 20 is formed on a surface of the substrate 10 on which a gate will be formed.

Figure 3F:
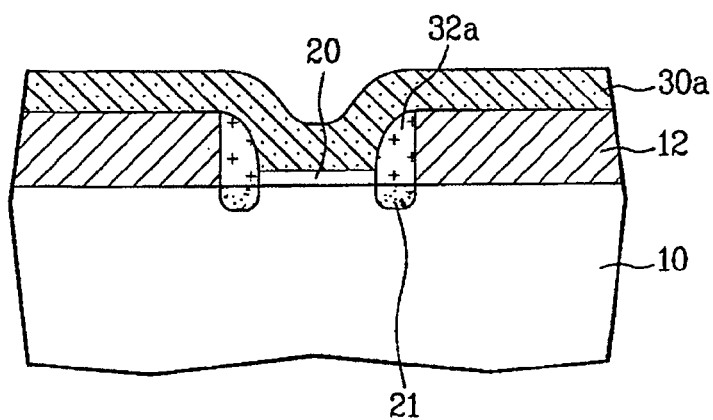

Referring to FIG. 3F, a polysilicon layer 30a is formed on the oxide layer pattern 12, the spacer oxide layer 32a and the gate oxide layer 20. The polysilicon layer 30a is formed enough to fill up a space enclosed by the spacer oxide layer 32a and the gate oxide layer 20.

Figure 3G:
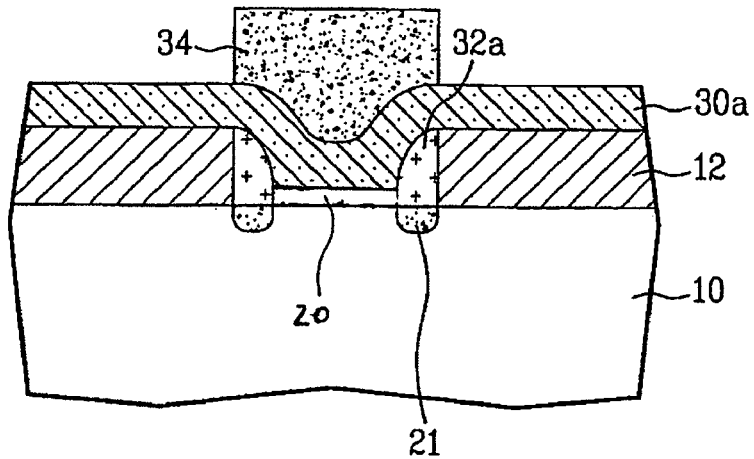

Referring to FIG. 3G, a photoresist is coated on the polysilicon layer 30a to form a photoresist pattern 34 for forming a gate electrode. Photolithography is performed to form the photoresist pattern 34. If a negative photoresist is used, the photomask used in FIG. 3A can be used again. Hence, a production cost can be reduced. As the photolithography can use the photomask having the relatively wider photomask shown in FIG. 3A, lithography of high precision is unnecessary.

The exposed polysilicon layer 30a failing in being covered with the photoresist pattern 34 is etched. In particular, the polysilicon on areas other than those corresponding to the gate electrode 30 is entirely removed. The oxide layer 12 beneath the polysilicon layer 30a is entirely removed as well. The gate electrode 30 fabricated in the above-explained manner has a structure different from that of the related art. Namely, a channel width of the gate electrode 30 is formed to meet a design rule while a topside of the gate electrode 30 is formed wider.

Figure 3H:
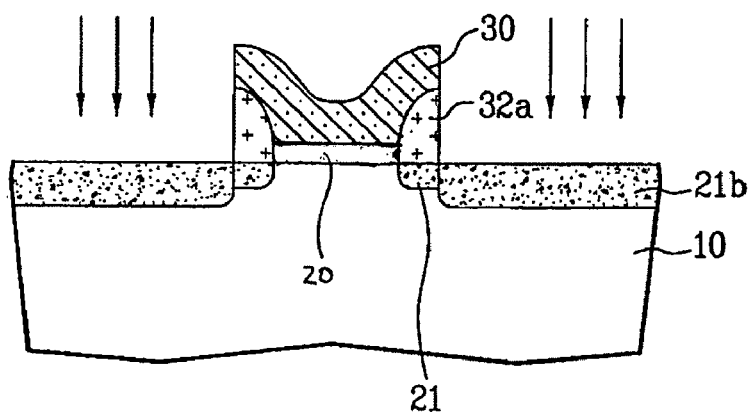

Referring to FIG. 3H, source/drain implantation is performed. In particular, high-density ion implantation with impurities having a conductive type opposite that of the substrate 10 is performed using the polysilicon gate 30 and spacer 32a as a barrier. Annealing is then performed to form heavily doped source/drain diffusion regions 21b.

Figure 3I:
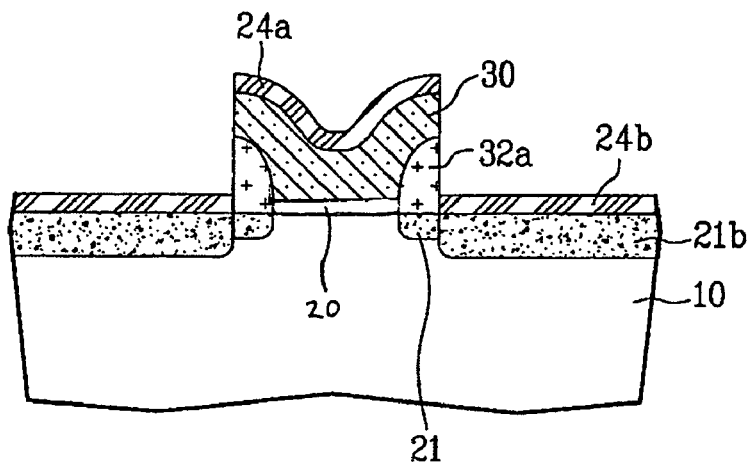

Referring to FIG. 3I, metal such as Co, Ti and the like is deposited over the substrate 10 to form salicide by reaction with silicon or polysilicon. Salicide layers are then formed on the polysilicon gate 30 and the source/drain diffusion regions 21b over the silicon substrate 10 by sintering. The metal failing in participating in the reaction is selectively removed by etching. Thus, the salicide layers 24a and 24b are formed on the polysilicon gate electrode 30 and the source/drain diffusion regions, respectively.

Therefore, the salicide layers 24a and 24b are stably formed on the gate electrode 30 having an area greater than that of the related art and the source/drain diffusion regions 21b, respectively. Hence, the present invention solves the problem of the space shortage. Accordingly, the fine line width and the corresponding sheet resistance can be effectively reduced.

Accordingly, the present invention provides a method of fabricating a MOS transistor, whereby the line width of the gate electrode can be narrowed without employing the lithography of high precision. Since the lithography process margin can be enhanced to twice that of a conventional art, the gate electrode having the minimum line width allowable by the design rule can be easily implemented without using high-precision equipment. Hence, process efficiency can be enhanced and the product cost can be lowered.

Moreover, in the present invention, by the structural modifications of the LDD regions and gate electrode, the topside area of the gate is increased and the area between the gates is extended. Therefore, salicide can be formed on a wider area to reduce the sheet resistance of the corresponding area. Hence, since the present invention is able to form the gate electrode having the maximal width when scaling down the transistor device, the degree of freedom in design is raised to eventually enhance performance of the transistor device. A MOS transistor semiconductor device according to the present invention can also minimize sheet resistance of each of the structurally modified gate electrode and LDD regions, since the salicide layer having an increased size is formed on each of the gate and the source/drain regions.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a MOS transistor, comprising steps of: coating a semiconductor substrate with a first oxide layer and removing a predetermined width of the first oxide layer by performing a photolithography process to the first oxide layer; forming a lightly doped drain (LDD) region by ion implantation and annealing using the first oxide layer as a barrier wherein the ion implantation uses impurities of a conductivity type opposite that of the semiconductor substrate; forming gate spacers by coating the semiconductor substrate with a second oxide layer and etching the second oxide layer; forming a channel in the LDD region by ion implantation and annealing using the first oxide layer and the gate spacers as a barrier, wherein the ion implantation to form the channel uses impurities having a conductivity type opposite that of the LDD region so as to cancel a part of the LDD region between the opposing edges of the gate spacers; forming a gate oxide layer on a surface of the semiconductor substrate between the opposing edges of the gate spacers; forming a polysilicon gate electrode by coating the first oxide layer, the gate spacer, and the gate oxide layer with a polysilicon layer and performing photolithography and etching processes to the polysilicon layer; and forming, by annealing, source/drain diffusion regions by ion implantation of impurities of a conductivity type opposite that of the semiconductor substrate using the gate electrode and the gate spacers as a barrier, wherein the photolithography process performed to the first oxide layer uses a first negative photoresist layer, the photolithography process performed to the polysilicon layer uses a second photoresist layer, and the etching process to the polysilicon layer removes a part of the polysilicon layer and the entire first oxide layer using the second photoresist as a mask.

2. The method of claim 1, wherein, in the etching process performed to the polysilicon layer, the polysilicon layer is entirely etched in areas other than an area reserved for the gate electrode.

3. The method of claim 1, further comprising forming salicide layers on the gate electrode and the source/drain diffusion regions, respectively, by forming a salicide metal on the substrate and performing sintering on the salicide metal.

* * * * *